United States Patent
Watanabe et al.

(10) Patent No.: US 6,871,311 B2
(45) Date of Patent: Mar. 22, 2005

(54) SEMICONDUCTOR INTEGRATED CIRCUIT HAVING A SELF-TESTING FUNCTION

(75) Inventors: Keiki Watanabe, Tachikawa (JP); Takashi Harada, Hidaka (JP); Satoshi Ueno, Ome (JP)

(73) Assignee: Hitachi, Ltd., Tokyo (JP)

( * ) Notice: Subject to any disclaimer, the term of this patent is extended or adjusted under 35 U.S.C. 154(b) by 583 days.

(21) Appl. No.: 09/939,589

(22) Filed: Aug. 28, 2001

(65) Prior Publication Data

US 2002/0040459 A1 Apr. 4, 2002

(30) Foreign Application Priority Data

Sep. 29, 2000 (JP) ........................................ 2000-298525

(51) Int. Cl.[7] ................................................ G06F 11/00
(52) U.S. Cl. ........................ 714/738; 375/221; 714/733
(58) Field of Search ................................ 714/738, 733; 713/400; 375/221; 324/763; 368/63; 370/249

(56) References Cited

U.S. PATENT DOCUMENTS

| | | | | |
|---|---|---|---|---|
| 4,225,958 A | * | 9/1980 | Funatsu | 714/733 |
| 4,545,686 A | * | 10/1985 | Ushikoshi | 368/63 |
| 4,833,395 A | * | 5/1989 | Sasaki et al. | 324/763 |
| 5,343,461 A | * | 8/1994 | Barton et al. | 370/249 |
| 5,353,434 A | * | 10/1994 | Katayama | 713/400 |
| 5,787,114 A | * | 7/1998 | Ramamurthy et al. | 375/221 |

FOREIGN PATENT DOCUMENTS

JP 2-19051 1/1990

* cited by examiner

*Primary Examiner*—Albert Deady
*Assistant Examiner*—Dipakkumar Gandhi
(74) *Attorney, Agent, or Firm*—Mattingly, Stanger, Malur & Brundidge, P.C.

(57) ABSTRACT

A semiconductor integrated circuit device includes a transmitting circuit capable of converting first parallel signals to a first serial signal, a receiving circuit capable of converting a second serial signal to second parallel signals, a test signal generating circuit, and an operation judging circuit, all of which are formed on a single semiconductor chip. The test signal generating circuit and the operation judging circuit are formed so as to operate in accordance with a clock having a frequency corresponding to a transfer rate of the first or second parallel signals.

6 Claims, 6 Drawing Sheets

SEMICONDUCTOR INTEGRATED CIRCUIT HAVING A SELF-TESTING FUNCTION

BACKGROUND OF THE INVENTION

The present invention relates to a testing technique of semiconductor integrated circuits, and such a technique which is useful for application to communication LSIs.

In tests of semiconductor integrated circuits, there are included a DC (direct current) characteristic test, an AC (alternating current) characteristic test, and a function test. In the DC characteristic test, voltages of external terminals of an LSI and currents flowing through external terminals are measured in a DC manner. In the AC characteristic test, there are included measurements of the propagation delay time between input and output terminals, transition time of output waveforms, setup time, hold time, minimum clock pulse width, and maximum operation frequency. The function test is a test for determining whether the LSI operates without exhibiting an abnormality in its function when prescribed operation conditions are given to the LSI. In this function test, it is determined whether the function of the LSI is good by comparing signals output from the LSI with expected values when a test pattern is input to the LSI. For conducting such a function test, there are needed a pattern generating circuit for generating a test pattern and a comparing circuit for comparing signals output from the LSI with expected values. Some LSIs incorporate a pattern generating circuit and a comparing circuit, whereas some LSIs do not incorporate a pattern generating circuit and a comparing circuit. In the case where a pattern generating circuit and a comparing circuit are not incorporated, a pattern generating circuit and a comparing circuit disposed outside the LSI are used.

Furthermore, as described in JP-A-2-19051 (laid open on Jan. 23, 1990), there is known a modem control apparatus having a self test function for checking whether the transmission and reception function is normally performed. This modem control apparatus includes switch means for forming a loopback path by connecting modem ends of a receiving system control section and a transmitting system control section to each other when power is turned on, a pattern generator for supplying pattern data for a loopback test to an input side of the receiving system control section in synchronism with operation of the switch means, and a checker for comparing the pattern data output from the pattern generator with a result looped back via the receiving system control section, the switch means and the transmission system control section and conveying a result of the comparison to the control sections.

Especially in such an LSI as to conduct multiplexing processing of n channels as in an LSI for communication, it is necessary to demultiplex a signal output from the pattern generating circuit to n channels. In this case, therefore, the pattern signal actually generated in the test pattern generating circuit must have a frequency that is n times the frequency of the test pattern used in the test of the LSI. As the clock frequency of the LSI becomes higher, design of a pattern generating circuit corresponding thereto becomes difficult. In addition, in a judging circuit, which receives a response pattern, signal synchronization is needed in signal comparison. If the frequency of the operation clock becomes high, however, signal synchronization also becomes difficult.

In JP-A-2-19051, detailed configurations in respective blocks are not shown. However, it is necessary to supply a signal generated by the pattern generator to the receiving system control section and supply it to the checker as well, for the purpose of comparing it with an output signal of the transmission system control section.

SUMMARY OF THE INVENTION

An object of the present invention is to provide a technique for conducting tests of semiconductor integrated circuits easily and inexpensively.

The above described and other objects and novel features will become apparent from the ensuing description and accompanying drawing.

In accordance with one aspect of the present invention, a semiconductor integrated circuit includes on a single semiconductor chip: a test mode input terminal supplied with a test mode signal; a transmitting circuit having a function of converting first parallel signals for a plurality of channels to a first serial signal; a receiving circuit having a function of converting a second serial signal to second parallel signals for a plurality of channels; a test signal generating circuit responsive to the test mode signal, for generating test parallel signals to be supplied to the transmitting circuit; a first selector for supplying either the test parallel signals or the first parallel signals to the transmitting circuit; a second selector responsive to the test mode signal, for supplying either the first serial signal or the second serial signal to the receiving circuit; and an operation judging circuit responsive to the test mode signal, the operation judging circuit being connected so as to receive response parallel signals from the receiving circuit.

The test signal generating circuit includes first circuits for generating test parallel signals that are equivalent to the first parallel signals for a plurality of channels.

The operation judging circuit includes: second circuits each capable of holding a value of one pulse of its associated one of pulse sequences of the response parallel signals received from the receiving circuit; third circuits for generating expected values for pulses of pulse sequences in the response parallel signals received from the receiving circuit after the pulses whose signal values have been held, based on signal values held in the second circuit; and fourth circuits for comparing values of pulses of the pulse sequences in the response parallel signals received from the receiving circuit with the expected values generated by the third circuit.

The test signal generating circuit and the operation judging circuit may be formed so as to operate in accordance with a clock having a frequency corresponding to a transfer rate of the first or second parallel signals.

DESCRIPTION OF THE EMBODIMENTS

Figure 1:
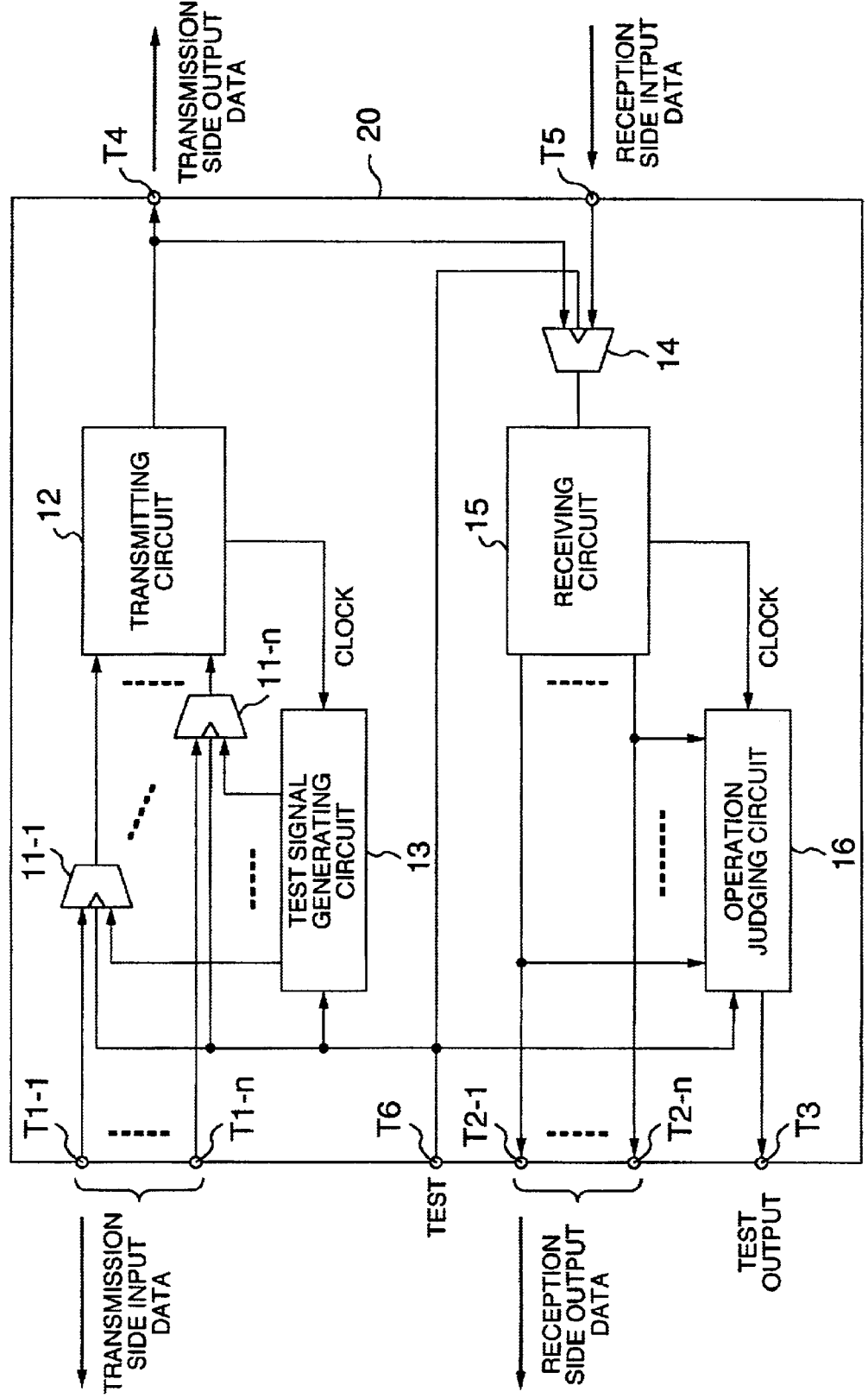
FIG. 1 is a block diagram showing a configuration example of a communication LSI, which is an example of a semiconductor integrated circuit according to an embodiment of the present invention.

FIG. 1 shows a communication LSI, which is an example of a semiconductor integrated circuit according to an embodiment of the present invention.

Although not especially limited, a communication LSI 20 shown in FIG. 1 is formed on one semiconductor substrate such as, for example, a single crystal silicon substrate by using a known semiconductor integrated circuit fabrication technique.

Although not especially limited, the communication LSI 20 is incorporated in a transceiver for fast optical communication. The communication LSI 20 includes a transmitting circuit 12 and a receiving circuit 15.

The transmitting circuit 12 has a function of multiplexing transmission side data (first parallel signals) supplied from the outside via n (where n is a positive integer) transmission side input terminals T1-1 to T1-n, thereby converting them to a first serial signal, and transmitting the first serial signal. Output data (the first serial signal) from the transmitting circuit 12 is output to the outside via a transmission side output terminal T4.

The receiving circuit 15 has a function of converting serial data (a second serial signal) supplied from the outside via a reception side input terminal T5 to parallel data and outputting the parallel data. Output data (second parallel signals) of the receiving circuit 15 are output to the outside via reception side output terminals T2-1 to T2-n.

In the transceiver for fast optical communication, the transmission side output terminal T4 and the reception side input terminal T5 are coupled to a front end, which is not illustrated. The front end includes an optical modulation circuit for modulating laser light on the basis of the output data from the transmission side output terminal T4, and a light receiving element for converting laser light supplied via an optical fiber to an electric signal. An electric signal obtained by the light receiving element is transmitted to the receiving circuit 15 via the reception side input terminal T5. Other multiplexing circuits (not illustrated) might be coupled to the transmission side input terminals T1-1 to T1-n. Multiplexed signals from the multiplexing circuits are taken into the chip via the transmission side input terminals T1-1 to T1-n. And other demultiplexing circuits (not illustrated) might be connected to the reception side output terminals T2-1 to T2-n. In those other demultiplexing circuits, each of n output data from the receiving circuit 15 is demultiplexed, respectively.

A test mode signal input terminal T6 for taking in a test mode signal TEST is provided. In the case where the test mode signal TEST input via the test mode signal input terminal T6 is at a low level, the communication LSI 20 is in an ordinary operation state. On the other hand, in the case where the test mode signal TEST is at a high level, the communication LSI 20 is in a test mode state.

A circuit configuration that makes the self test of the communication LSI 20 possible will now be described.

In order to make the self test of the communication LSI 20 possible, selectors 11-1 to 11-n and 14, a test signal generating circuit 13, and an operation judging circuit 16 (such as a comparing circuit) are provided.

Although not especially limited, the test signal generating circuit 13 generates a random pattern (test parallel signals) of a PN sequence (PRBS: Pseudo Random Bit Sequence) that is recommended for evaluation in International Telecommunication Union (ITU), ITU-T 0151, 0153, on the basis of a clock signal CLOCK supplied from the transmitting circuit 12.

At this time, in the present embodiment, the frequency of the clock signal CLOCK is a frequency corresponding to the transfer rate of the parallel signals supplied to the transmission side input terminals T1-1 to T1-n in ordinary operation of the LSI 20, and it is markedly low as compared with the conventional technique.

The selectors 11-1 to 11-n have a function of transferring either data (the first parallel signals) supplied via the transmission side input terminals T1-1 to T1-n or the test parallel signals supplied from the test signal generating circuit 13 to the transmitting circuit 12 according to the test mode signal TEST. Although not especially limited, the selectors 11-1 to 11-n transfer data supplied via the transmission side input terminals T1-1 to T1-n to the transmitting circuit 12 when the test mode signal TEST is at a low level, whereas the selectors 11-1 to 11-n transfer the test signal data (test parallel signals) supplied from the test signal generating circuit 13 to the transmitting circuit 12 when the test mode signal TEST is at a high level.

The selector 14 has a function of transferring either data (the second serial signal) supplied via the reception side data input terminal T5 or the output signal of the transmitting circuit 12 to the receiving circuit 15 according to the test mode signal TEST. Although not especially limited, the selector 14 transfers data (the second serial signal) supplied via the reception side data input terminal T5 to the receiving circuit 15 when the test mode signal TEST is at a low level, whereas the selector 14 transfers the output data supplied from the transmitting circuit 12 to the receiving circuit 15 when the test mode signal TEST is at a high level.

The operation judging circuit 16 has a function of judging whether the LSI 20 is operating normally on the basis of response parallel signals output from the receiving circuit 15. This judging is executed by using the clock signal CLOCK transferred from the receiving circuit 15. A result of judging in the operation judging circuit 16 is output to the outside via a test result output terminal T3.

Details of respective components will now be described.

Figure 2:
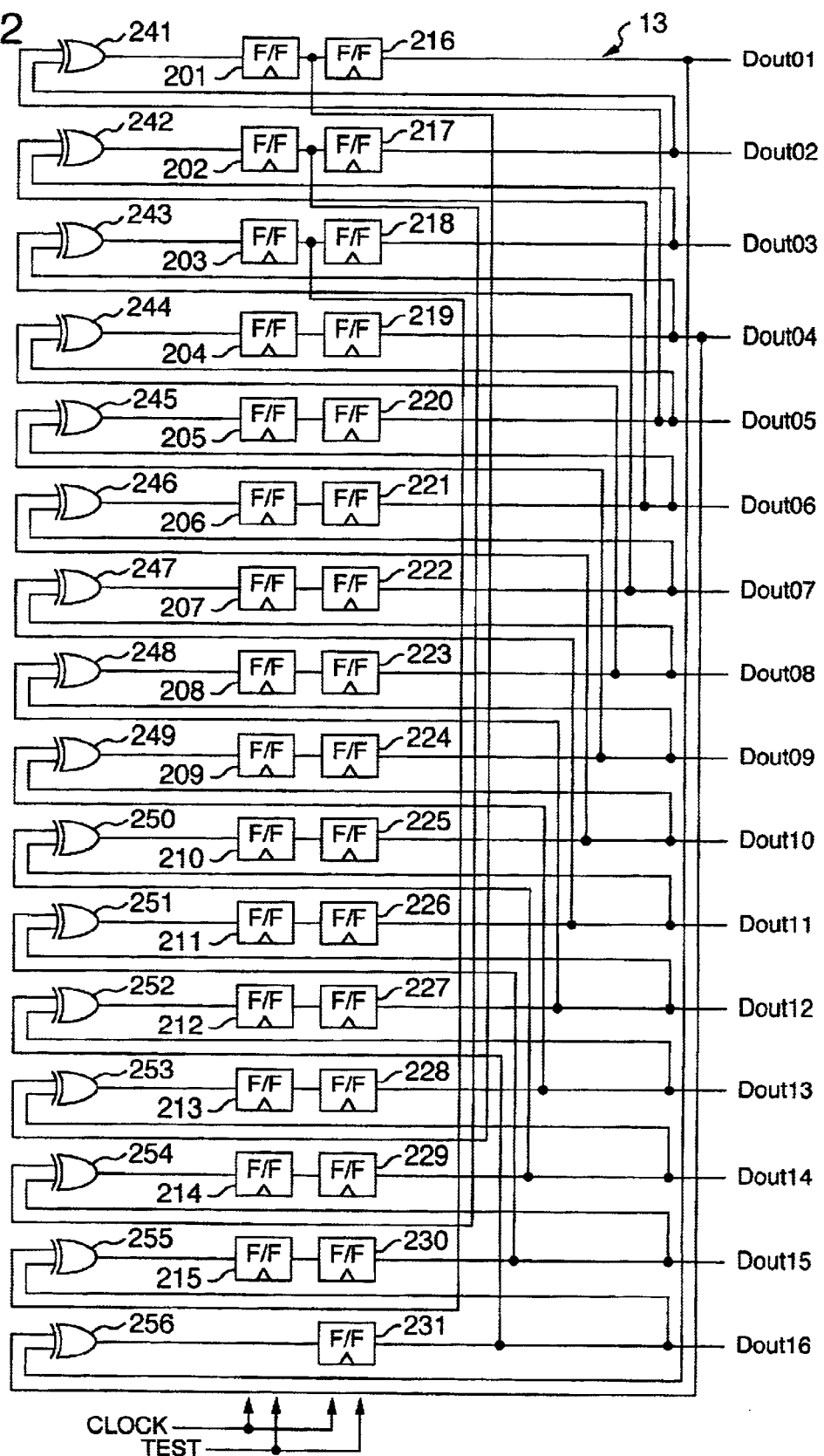
FIG. 2 is a circuit diagram showing a configuration example of a test signal generation circuit that can be used in a communication LSI according to an embodiment of the present invention.

FIG. 2 shows a configuration example of the test signal generating circuit 13.

Although not especially limited, the test signal generating circuit 13 has a configuration of thirty-one stages of a PN sequence. The test signal generating circuit 13 is formed by coupling thirty-one flip-flop circuits 201 to 231 and 16 exclusive-OR circuits 241 to 255. Test data (the test parallel signals) Dout01 to Dout16 in a parallel form are obtained from the flip-flop circuits 216 to 231. The flip-flop circuits 201 to 215 are disposed in a stage preceding the stage of the flip-flop circuits 216 to 230. Output signals of the flip-flop circuits 201 to 215 are taken in by the flip-flop circuits 216 to 130 of the subsequent stage.

An exclusive OR circuit 241 performs an exclusive OR-ing function on the test data Dout02 and the test data Dout05, and supplies a result thereof to the flip-flop circuit 201 located in the subsequent stage. An exclusive OR circuit 242 performs an exclusive OR-ing function on the test data Dout03 and the test data Dout06, and supplies a result thereof to the flip-flop circuit 202 located in the subsequent stage. An exclusive OR circuit 243 performs an exclusive OR-ing function on the test data Dout04 and the test data Dout07, and supplies a result thereof to the flip-flop circuit 203 located in the subsequent stage. An exclusive OR circuit 244 performs an exclusive OR-ing function on the test data Dout05 and the test data Dout08, and supplies a result thereof to the flip-flop circuit 204 located in the subsequent stage. An exclusive OR circuit 245 performs an exclusive OR-ing function on the test data Dout06 and the test data Dout09, and supplies a result thereof to the flip-flop circuit 205 located in the subsequent stage. An exclusive OR circuit 246 performs an exclusive OR-ing function on the test data Dout07 and the test data Dout10, and supplies a result thereof to the flip-flop circuit 206 located in the subsequent stage. An exclusive OR circuit 247 performs an exclusive OR-ing function on the test data Dout08 and the test data Dout11, and supplies a result thereof to the flip-flop circuit 207 located in the subsequent stage. An exclusive OR circuit 248 performs an exclusive OR-ing function on the test data Dout09 and the test data Dout12, and supplies a result thereof to the flip-flop circuit 208 located in the subsequent stage. An exclusive OR circuit 249 performs an exclusive OR-ing function on the test data Dout10 and the test data Dout13, and supplies a result thereof to the flip-flop circuit 209 located in the subsequent stage. An exclusive OR circuit 250 performs an exclusive OR-ing function on the test data Dout11 and the test data Dout14, and supplies a result thereof to the flip-flop circuit 210 located in the subsequent stage. An exclusive OR circuit 251 performs an exclusive OR-ing function on the test data Dout12 and the test data Dout15, and supplies a result thereof to the flip-flop circuit 211 located in the subsequent stage. An exclusive OR circuit 252 performs an exclusive OR-ing function on the test data Dout13 and the test data Dout16, and supplies a result thereof to the flip-flop circuit 212 located in the subsequent stage. An exclusive OR circuit 253 performs an exclusive OR-ing function on the test data Dout14 and test data from the flip-flop circuit 201, and supplies a result thereof to the flip-flop circuit 213 located in the subsequent stage. An exclusive OR circuit 254 performs an exclusive OR-ing function on the test data Dout15 and test data from the flip-flop circuit 202, and supplies a result thereof to the flip-flop circuit 214 located in the subsequent stage. An exclusive OR circuit 255 performs an exclusive OR-ing function on the test data Dout16 and test data from the flip-flop circuit 203, and supplies a result thereof to the flip-flop circuit 215 located in the subsequent stage. An exclusive OR circuit 256 performs an exclusive OR-ing function on the test data Dout01 and the test data Dout04, and supplies a result thereof to the flip-flop circuit 231 located in the subsequent stage.

The flip-flop circuits 201 to 215 and 216 to 231 operate in synchronism with the clock signal CLOCK. The flip-flop circuits 201 to 215 and 216 to 231 are in the reset state when the test mode signal TEST is at a low level. When the test mode signal TEST is at a high level, the reset state is canceled and a test pattern is generated. By this reset, the flip-flop circuits 201 to 215 and 216 to 231 are made to have a logic 1 as the initial value.

Here, the flip-flop circuits 201 to 231 and the exclusive OR circuits 241 to 256 are shown as an example of a first circuit in the present embodiment. As described above, the test signal generating circuit 13 operates in accordance with the clock signal CLK supplied from the transmitting circuit 12. The frequency of clock signal CLK is a frequency corresponding to the transfer rate of the parallel signals supplied to the transmission side input terminals, and it is markedly lower as compared with the conventional technique.

Figure 3:
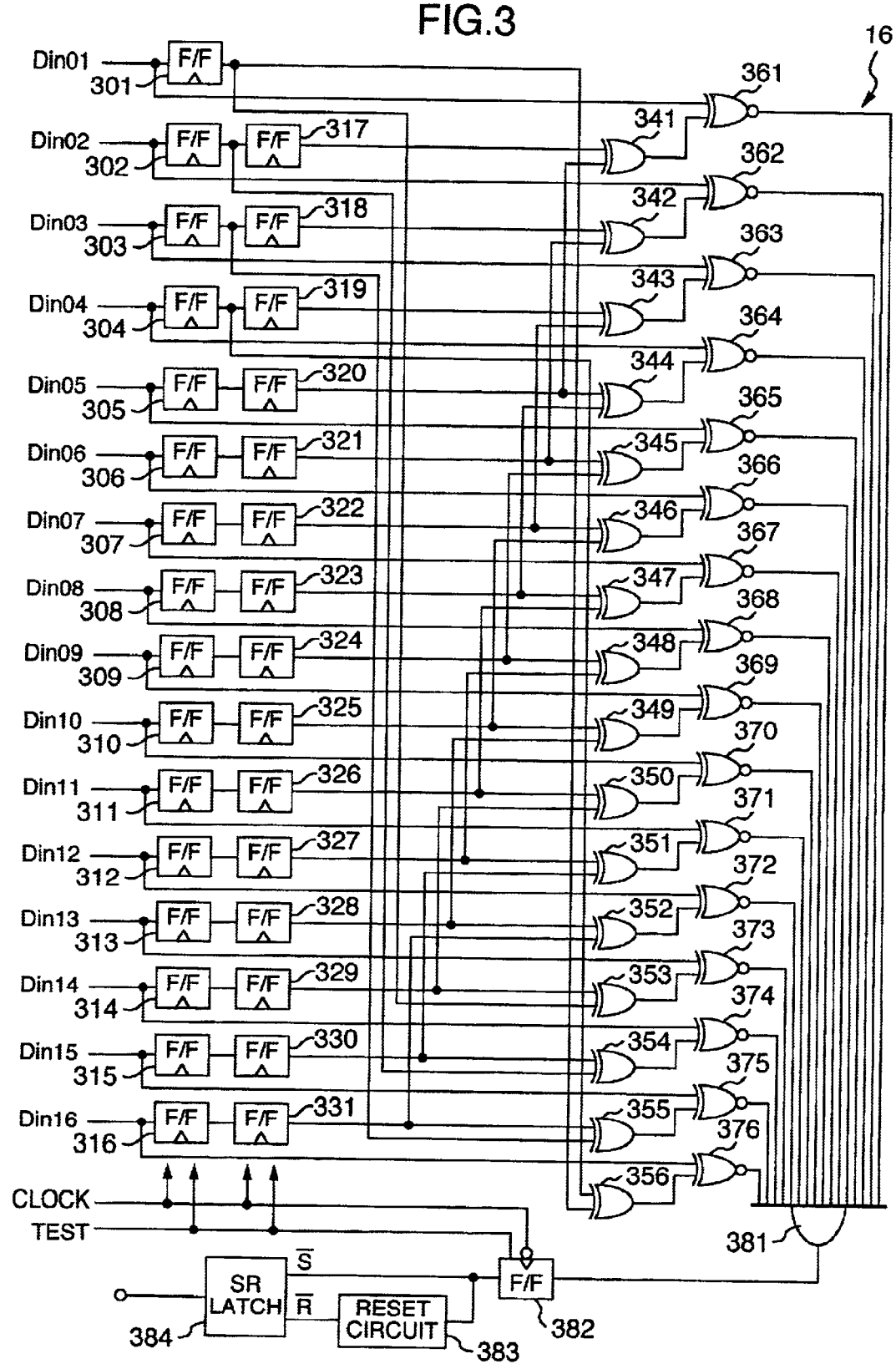
FIG. 3 is a circuit diagram showing a configuration example of an operation judging circuit that can be used in a communication LSI according to an embodiment of the present invention.

FIG. 3 shows a configuration example of the operation judging circuit 16.

There are provided flip-flop circuits 301 to 316 for taking in the response data (the response parallel signals) Din01 to Din16 transferred from the receiving circuit 15. In a stage subsequent to the flip-flop circuits 302 to 316, there are disposed flip-flop circuits 317 to 331, to which output signals of the flip-flop circuits 302 to 316 are transferred. The flip-flop circuits 301 to 331 correspond to the flip-flop circuits 201 to 231 (see FIG. 2) included in the test signal generating circuit 13. The exclusive OR circuits 341 to 356 correspond to the exclusive OR circuits 241 to 256 (see FIG. 2) included in the test signal generating circuit 13.

An exclusive OR circuit 341 performs an exclusive OR-ing function on an output signal of the flip-flop circuit 317 and an output signal of the flip-flop circuit 320, and supplies a result thereof to an exclusive NOR circuit 361 located in a subsequent stage. An exclusive OR circuit 342 performs an exclusive OR-ing function on an output signal of the flip-flop circuit 318 and an output signal of the flip-flop circuit 321, and supplies a result thereof to an exclusive NOR circuit 362 located in a subsequent stage. An exclusive OR circuit 343 performs an exclusive OR-ing function on an output signal of the flip-flop circuit 319 and an output signal of the flip-flop circuit 322, and supplies a result thereof to an exclusive NOR circuit 363 located in the subsequent stage. An exclusive OR circuit 344 performs an exclusive OR-ing function on an output signal of the flip-flop circuit 320 and an output signal of the flip-flop circuit 323, and supplies a result thereof to an exclusive NOR circuit 364 located in the subsequent stage. An exclusive OR circuit 345 performs an exclusive OR-ing function on an output signal of the flip-flop circuit 321 and an output signal of the flip-flop circuit 324, and supplies a result thereof to an exclusive NOR circuit 365 located in the subsequent stage. An exclusive OR circuit 346 performs an exclusive OR-ing function on an output signal of the flip-flop circuit 322 and an output signal of the flip-flop circuit 325, and supplies a result thereof to an exclusive NOR circuit 366 located in the subsequent stage. An exclusive OR circuit 347 performs an exclusive OR-ing function on an output signal of the flip-flop circuit 323 and an output signal of the flip-flop circuit 326, and supplies a result thereof to an exclusive NOR circuit 367 located in the subsequent stage. An exclusive OR circuit 348 performs an exclusive OR-ing function on an output signal of the flip-flop circuit 324 and an output signal of the flip-flop circuit 327, and supplies a result thereof to an exclusive NOR circuit 368 located in the subsequent stage. An exclusive OR circuit 349 performs an exclusive OR-ing function on an output signal of the flip-flop circuit 325 and an output signal of the flip-flop circuit 328, and supplies a result thereof to an exclusive NOR circuit 369 located in the subsequent stage. An exclusive OR circuit 350 performs an exclusive OR-ing function on an output signal of the flip-flop circuit 326 and an output signal of the flip-flop circuit 329, and supplies a result thereof to an exclusive NOR circuit 370 located in the subsequent stage. An exclusive OR circuit 351 performs an exclusive OR-ing function on an output signal of the flip-flop circuit 327 and an output signal of the flip-flop circuit 330, and supplies a result thereof to an exclusive NOR circuit 371 located in the subsequent stage. An exclusive OR circuit 352 performs an exclusive OR-ing function on an output signal of the flip-flop circuit 328 and an output signal of the flip-flop circuit 331, and supplies a result thereof to an exclusive NOR circuit 372 located in the subsequent stage. An exclusive OR circuit 353 performs an exclusive OR-ing function on an output signal of the flip-flop circuit 329 and an output signal of the flip-flop circuit 301, and supplies a result thereof to an exclusive NOR circuit 373 located in the subsequent stage. An exclusive OR circuit 354 performs an exclusive OR-ing function on an output signal of the flip-flop circuit 330 and an output signal of the flip-flop circuit 302, and supplies a result thereof to an exclusive NOR circuit 374 located in the subsequent stage. An exclusive OR circuit 355 performs an exclusive OR-ing function on an output signal of the flip-flop circuit 331 and an output signal of the flip-flop circuit 303, and supplies a result thereof to an exclusive NOR circuit 375 located in the subsequent stage. An exclusive OR circuit 356 performs an exclusive OR-ing function on an output signal of the flip-flop circuit 301 and an output signal of the flip-flop circuit 304, and supplies a result thereof to an exclusive NOR circuit 376 located in the subsequent stage. An exclusive NOR circuit 361 performs an exclusive NOR-ing function on the newly input response data Din01 and the output signal of the exclusive OR circuit 341, and supplies a result thereof to an AND circuit 381 located in a subsequent stage. An exclusive NOR circuit 362 performs an exclusive NOR-ing function on the newly input response data Din02 and the output signal of the exclusive OR circuit 342, and supplies a result thereof to the AND circuit 381 located in the subsequent stage. An exclusive NOR circuit 363 performs an exclusive NOR-ing function on the newly input response data Din03 and the output signal of the exclusive OR circuit 343, and supplies a result thereof to the AND circuit 381 located in the subsequent stage. An exclusive NOR circuit 364 performs an exclusive NOR-ing function on the newly input response data Din04 and the output signal of the exclusive OR circuit 344, and supplies a result thereof to the AND circuit 381 located in the subsequent stage. An exclusive NOR circuit 365 performs an exclusive NOR-ing function on the newly input response data Din05 and the output signal of the exclusive OR circuit 345, and supplies a result thereof to the AND circuit 381 located in the subsequent stage. An exclusive NOR circuit 366 performs an exclusive NOR-ing function on the newly input response data Din06 and the output signal of the exclusive OR circuit 346, and supplies a result thereof to the AND circuit 381 located in the subsequent stage. An exclusive NOR circuit 367 performs an exclusive NOR-ing function on the newly input response data Din07 and the output signal of the exclusive OR circuit 347, and supplies a result thereof to the AND circuit 381 located in the subsequent stage. An exclusive NOR circuit 368 performs an exclusive NOR-ing function on the newly input response data Din08 and the output signal of the exclusive OR circuit 348, and supplies a result thereof to the AND circuit 381 located in the subsequent stage. An exclusive NOR circuit 369 performs an exclusive NOR-ing function on the newly input response data Din09 and the output signal of the exclusive OR circuit 349, and supplies a result thereof to the AND circuit 381 located in the subsequent stage. An exclusive NOR circuit 370 performs an exclusive NOR-ing function on the newly input response data Din10 and the output signal of the exclusive OR circuit 350, and supplies a result thereof to the AND circuit 381 located in the subsequent stage. An exclusive NOR circuit 371 performs an exclusive NOR-ing function on the newly input response data Din11 and the output signal of the exclusive OR circuit 351, and supplies a result thereof to the AND circuit 381 located in the subsequent stage. An exclusive NOR circuit 372 performs an exclusive NOR-ing function on the newly input response data Din12 and the output signal of the exclusive OR circuit 352, and supplies a result thereof to the AND circuit 381 located in the subsequent stage. An exclusive NOR circuit 373 performs an exclusive NOR-ing function on the newly input response data Din13 and the output signal of the exclusive OR circuit 353, and supplies a result thereof to the AND circuit 381 located in the subsequent stage. An exclusive NOR circuit 374 performs an exclusive NOR-ing function on the newly input response data Din14 and the output signal of the exclusive OR circuit 354, and supplies a result thereof to the AND circuit 381 located in the subsequent stage. An exclusive NOR circuit 375 performs an exclusive NOR-ing function on the newly input response data Din15 and the output signal of the exclusive OR circuit 355, and supplies a result thereof to the AND circuit 381 located in the subsequent stage. An exclusive NOR circuit 376 performs an exclusive NOR-ing function on the newly input response data Din16 and the output signal of the exclusive OR circuit 356, and supplies a result thereof to the AND circuit 381 located in the subsequent stage.

The flip-flop circuits 301 to 331 operate in synchronism with the clock signal CLOCK supplied from the receiving circuit 15. The flip-flop circuits 301 to 331 are in the reset state when the test mode signal TEST is at a low level. When the test mode signal TEST is changed from the low level to the high level, the reset state is canceled. By this reset, the flip-flop circuits 301 to 331 are made to have a logic 1 as the initial value.

The frequency of clock signal CLK is a frequency corresponding to the transfer rate of the parallel signals supplied from the receiving circuit 15 to the reception side output terminals T2-1 to T2-n. Therefore, the operation judging circuit 16 operates with a clock signal having a frequency that is markedly lower as compared with the conventional technique.

Data held by the flip-flop circuits 301 to 331 (previously input data) are subject to logic operation in the exclusive OR circuits 341 to 356. Data equivalent to the test data Dout01 to Dout16 currently output from the test signal generating circuit 13 are obtained in outputs of the exclusive OR circuits 341 to 356. These data become expected values of pattern data output from the receiving circuit 15 in the case where predetermined random pattern data from the test signal generating circuit 13 are supplied to the transmitting circuit 12. Matching decision between the test pattern and the response pattern is conducted by comparing these with the response data Din01 to Din16 in the exclusive NOR circuits 361 to 376. If all bits of the response data Din01 to Din16 coincide with the corresponding expected values (output signals of the exclusive OR circuits 341 to 356), then all of outputs of the exclusive NOR circuits 361 to 376 become high levels and consequently the output of the AND circuit 381 becomes a high logic level.

On the other hand, if the input data Din01 to Din16 do not coincide with the expected values (output signals of the exclusive OR circuits 341 to 356) even in one bit, then it means a failure of the transmitting circuit 12 or the receiving circuit 15. In this case, all output signals of the exclusive NOR circuits 361 to 376 do not become high levels, and the output terminal of the AND circuit 381 becomes a low level. As a result, an SR latch circuit 384 is set and the SR latch circuit 384 is fixed to a low level in its output signal. The fact that the output signal of the SR latch circuit has been fixed to the low level is conveyed to an external output or a host system via a signal transfer path, which is not illustrated. Once the SR latch circuit 384 is set, the output logic level is fixed unless the SR latch circuit 384 is reset by a reset circuit 383. Even if the output signal of the AND circuit 381 becomes the high level thereafter, therefore, the output logic level is not changed thereby.

If the test mode signal TEST is at the low level, then the reset circuit 383 resets the SR latch circuit 384. After a predetermined time has elapsed since transition of the test mode signal TEST from the low level to the high level, the reset signal of the SR latch circuit 384 is changed from the low level to the high level and thereby the reset state of the SR latch circuit 384 is canceled. The reason why the reset cancel of the SR latch circuit 384 is thus delayed will now be described.

Immediately after the test mode signal TEST is changed from the low level to the high level, the circuit operation is unstable. After logic levels of the flip-flop circuits 301 to 331, the exclusive OR circuits 341 to 356, the exclusive OR circuits 361 to 376, and the AND circuit 381 have been established, therefore, the reset state of the SR latch circuit 384 is canceled. It is thus prevented that the SR latch circuit 384 is set by an undesired signal. That is the reason.

Here, the flip-flop circuits 301 to 331 exemplify second circuits in the present embodiment. The exclusive OR circuits 341 to 356 exemplify third circuits in the present embodiment. The exclusive NOR circuits 361 to 376 exemplify fourth circuits in the present embodiment.

Figure 4:
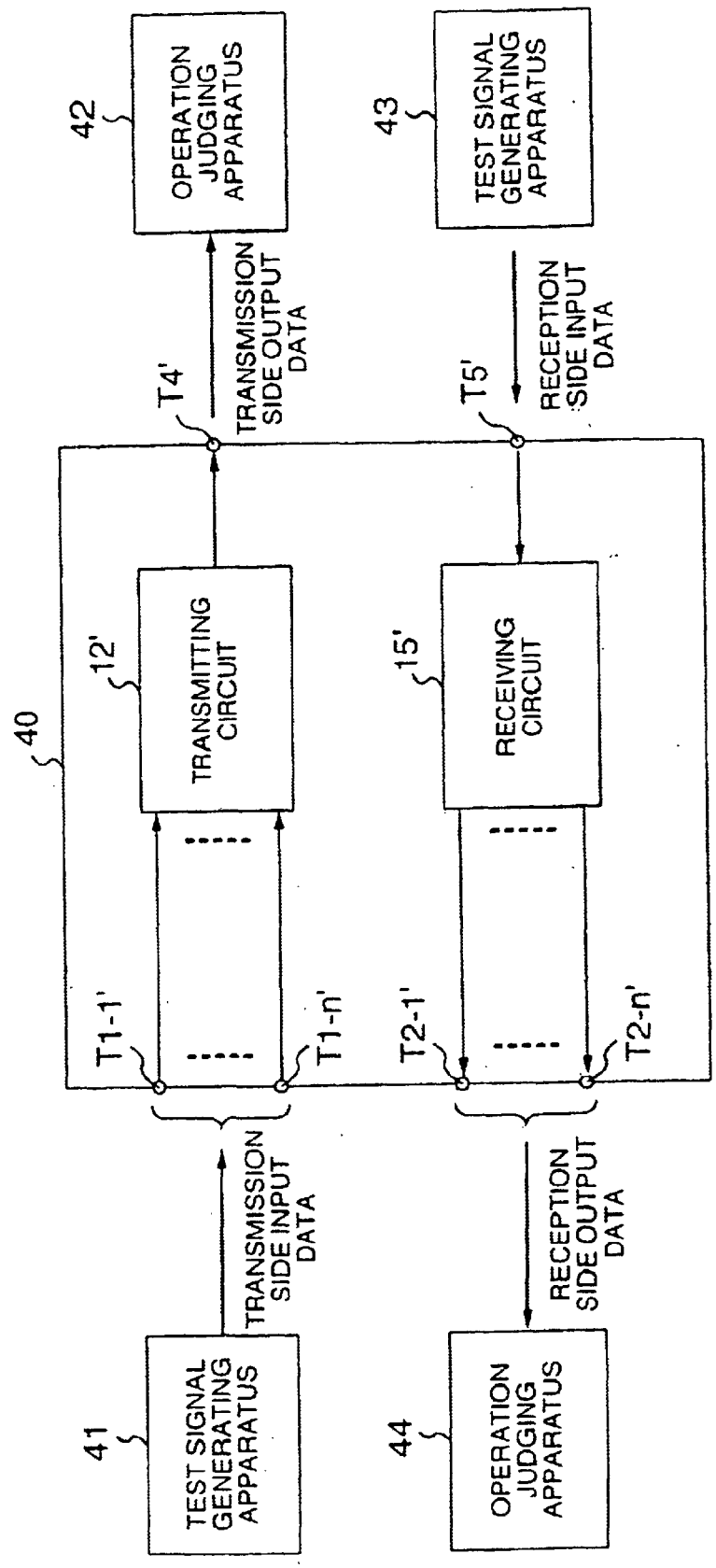
FIG. 4 is a diagram showing conventional LSI tests.

FIG. 4 shows a circuit to be compared with the communication LSI 20.

A communication LSI 40 shown in FIG. 4 differs remarkably from the communication LSI 20 shown in FIG. 1 in that the test signal generating circuit 13, the selectors 11-1 to 11-n, and the operation judging circuit 16 are not incorporated. When testing the communication LSI 40, therefore, test signal generating apparatuses 41 and 43 and operation judging apparatuses 42 and 44 are coupled to the communication LSI. Test pattern (random pattern) data generated by the test signal generating apparatus 41 are transferred to a transmitting circuit 12' via transmission side input terminals T1-1' to T1-n'. In that case, pattern data output from the transmitting circuit 12' are supplied to the operation judging apparatus 42 via a transmission side output terminal T4', and compared with expected values therein. Matching decision of the pattern data is thus conducted. In the same way, test pattern (random pattern) data generated by the test signal generating apparatus 43 are transferred to a receiving circuit 15' via reception side input terminal T5'. In that case, pattern data output from the receiving circuit 15' are supplied to the operation judging apparatus 44 via reception side output terminals T2-1' to T2-n', and compared with expected values therein. Matching decision of the pattern data is thus conducted.

Figure 5:
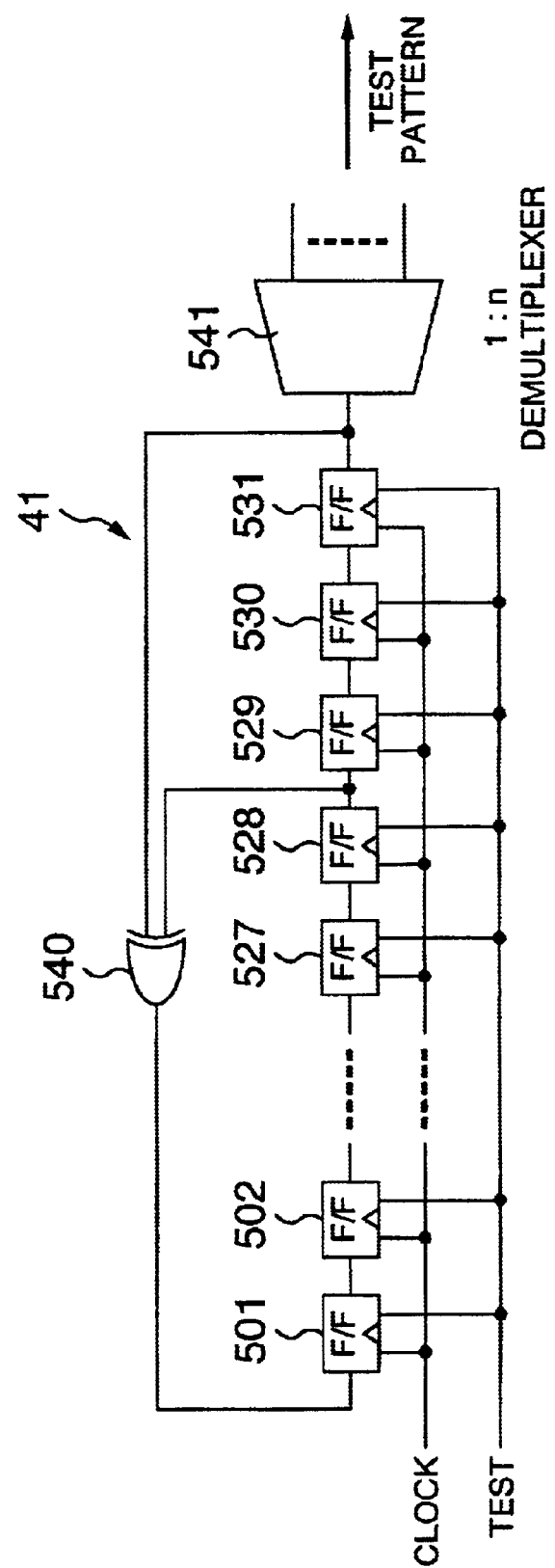
FIG. 5 is a circuit diagram showing a configuration example of a test signal generation circuit shown in FIG. 4.

FIG. 5 shows a configuration example of the test signal generating apparatus 41.

The test signal generating apparatus 41 generates a test pattern of thirty-one stages of PN. As shown in FIG. 5, the test signal generating apparatus 41 is formed by coupling thirty-one flip-flop circuits 501 to 531, an exclusive OR circuit 540 and a multiplexer 541. The thirty-one flip-flop circuits 501 to 531 are connected in series. The exclusive OR circuit 540 performs an exclusive OR-ing function on output signals of the flip-flop circuit 528 and the flip-flop circuit 531. Its result is transferred to an input terminal of the flip-flop circuit 501. The flip-flop circuits 501 to 531 operate in synchronism with a clock signal CLOCK. The flip-flop circuits 501 to 531 are reset by a reset signal RESET. By this reset, the flip-flop circuits 501 to 531 are made to have a logic 1 as the initial value. The transmitting circuit 12' has a plurality of input channels. Therefore, the output signal of the flip-flop circuit 531 is transferred to the demultiplexer 541 of the subsequent stage, and demultiplexed at a ratio of 1:n therein. Thus, test pattern data of a parallel form are obtained. The test pattern data are transferred to the transmitting circuit 12'. Since demultiplexing is conducted at a ratio of 1:n, it is necessary to generate the PN pattern with a frequency that is n times that of the test pattern. For example, in the case where such a frequency as to exceed 100 MHz is used in the semiconductor integrated circuit 20, the circuit design becomes difficult.

Figure 6:
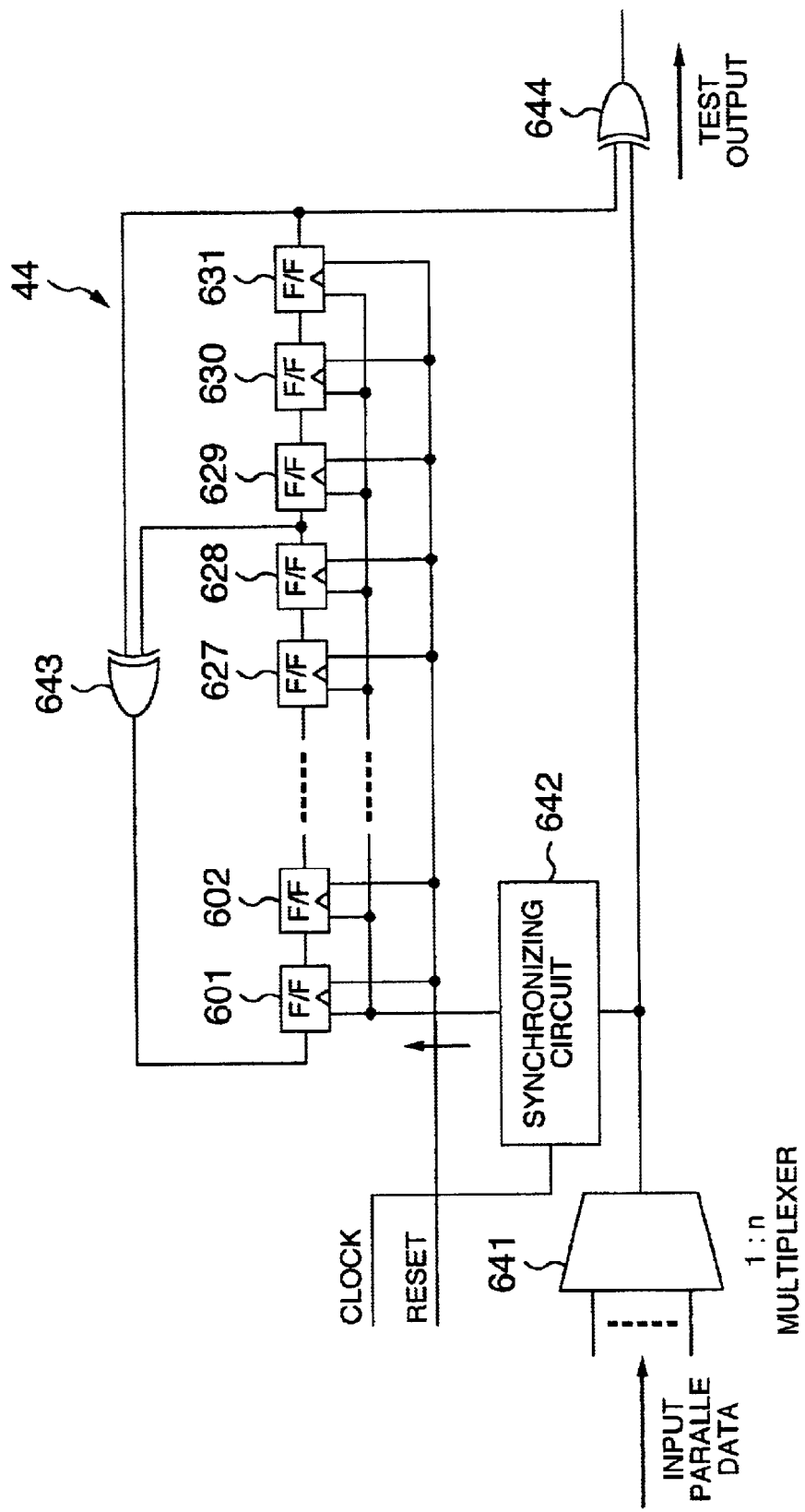
FIG. 6 is a circuit diagram showing a configuration example of an operation judging circuit shown in FIG. 4.

FIG. 6 shows a configuration example of the operation judging apparatus 44.

The operation judging apparatus 44 is formed by coupling thirty-one flip-flop circuits 601 to 631, a multiplexer 641, a synchronizing circuit 642, and exclusive OR circuit 643 and 644. The exclusive OR circuit 643 performs an exclusive OR-ing function on output signals of the flip-flop circuit 628 and the flip-flop circuit 631. A result thereof is transferred to the flip-flop circuit 601. A Signals output from the receiving circuit 15 are supplied to the multiplexer 641 and converted to a serial form with a ratio of n:1. An output signal of the multiplexer 641 and the output signal of the flip-flop circuit 631 are compared with each other by the exclusive OR circuit 644. A result of this comparison is output as a matching decision result. In the logical comparison conducted in the exclusive OR circuit 644, the output signal of the flip-flop circuit 631 needs to be synchronized to the output signal of the multiplexer 641. Therefore, the synchronizing circuit 642 for synchronizing the output signal of the flip-flop circuit 631 with the output signal of the multiplexer 641 is indispensable. However, it is necessary to make the operation judging apparatus operate at a frequency which is n times that of the semiconductor integrated circuit 40. In such a case, especially design of the synchronizing circuit becomes difficult.

On the other hand, the communication LSI 20 shown in FIG. 1 brings about the following operational effects.

(1) Since the test signal generating circuit 13 and the operation judging circuit 16 are incorporated in the semiconductor integrated circuit, it becomes unnecessary to prepare the test signal generating circuit 13 and the operation judging circuit 16 outside the chip. As a result, the manufacturing cost of the communication LSI can be reduced. Furthermore, the test signal generating circuit 13 is formed so as to include the first circuits for generating a predetermined random pattern, and the output terminals that are pulled out from the first circuits and that are capable of outputting the test parallel signals in such a state that the random pattern is divided into n parts. Accordingly, the test pattern generated by the test signal generating circuit 13 can be supplied to the transmitting circuit 12 in the parallel form. Therefore, it becomes unnecessary to demultiplex the signal output from the test signal generating circuit 13 to n channels. As a result, the frequency of the test signal actually generated in the test signal generating circuit 13 may be the frequency of the test pattern needed in the test of the semiconductor integrated circuit 20. It is thus unnecessary to generate the test signal at a frequency of n times by considering the pattern data demultiplexing conducted by the demultiplexer. Therefore, the circuit design and, in addition, the test of the semiconductor integrated circuit can be facilitated.

(2) In the test signal generating circuit, there are provided a plurality of flip-flop circuits 216 to 231 corresponding to the test parallel signals, a plurality of flip-flop circuits 201 to 215 disposed in a stage preceding that of the flip-flop circuits 216 to 231, and exclusive OR circuits 241 to 256 each for comparing logic values of two bits located at a distance of, for example, three bits between and included in the test parallel signals supplied from a plurality of flip-flop circuits 216 to 231 and supplying results of the comparison to corresponding flip-flop circuits 201 to 215 and 231. As a result, a random pattern of a plurality of channels corresponding to the parallel signals can be generated easily.

(3) In the operation judging circuit 16, there is provided the AND circuit 381 for performing an AND-ing function on a plurality of output signals of the exclusive NOR circuits 361 to 376. As a result, the number of bits of the test pattern matching decision result can be reduced.

(4) In the operation judging circuit 16, there are provided the flip-flop circuit 382 for taking in the output signal of the AND circuit 381 in synchronism with a clock signal supplied from the receiving circuit; and the SR latch circuit 384 that is set by the output signal of the flip-flop circuit 382. After the SR latch circuit 384 is set by the output signal of the flip-flop circuit 382, the result of matching decision between the test pattern and the response pattern can be prevented from being destroyed by a signal output by the flip-flop circuit 382 thereafter.

(5) In the operation judging circuit 16, there is provided a reset circuit 383 capable of canceling the reset state of the SR latch circuit 384 upon elapse of a predetermined time after the circuit disposed in the stage preceding that of the SR latch circuit 384 is reset. As a result, an undesired logic signal can be prevented from being held in the SR latch circuit 384.

(6) In the operation judging circuit 16, the expected values can be obtained on the basis of the output signals of the receiving circuit 15. Therefore, it is not necessary to take the test pattern signal generated by the test signal generating circuit 13 into the operation judging circuit 16 as the expected values. As a result, a signal transfer path for supplying the test pattern signal from the test signal generating circuit 13 to the operation judging circuit 16 becomes unnecessary. In addition, in the signal comparison in the operation judging circuit 16, it is not necessary to synchronize the signal with respect to the test signal generating circuit 13.

Heretofore, the invention made by the present inventors has been described concretely. However, the present invention is not limited thereto, but it is a matter of course that various modifications can be made without departing from the spirit of the invention.

For example, in the above described example, a test pattern of thirty-one stages of PN is generated. However, the test pattern is not limited thereto, but it can be change to, for example, twenty-three stages of PN.

Heretofore, the case where the invention made by the present inventors is applied to a communication LSI which is a field of its background utilization has been described. However, the present invention is not limited thereto, but the present invention can be applied widely to various semiconductor integrated circuits.

The present invention can be applied under the condition that at least a logic circuit is included.

What is claimed is:

1. A semiconductor integrated circuit formed on a single semiconductor chip, comprising:
   a test mode input terminal supplied with a test mode signal;
   a transmitting circuit having a function of converting first parallel signals for a plurality of channels to a first serial signal;
   a receiving circuit having a function of converting a second serial signal to second parallel signals for a plurality of channels;
   a test signal generating circuit responsive to said test mode signal, for generating test parallel signals to be supplied to said transmitting circuit;
   a first selector for supplying either said test parallel signals generated by said test signal generating circuit or said first parallel signals to said transmitting circuit;
   a second selector responsive to said test mode signal, for supplying either said first serial signal supplied from said transmitting circuit or said second serial signal to said receiving circuit; and
   an operation judging circuit responsive to said test mode signal, said operation judging circuit being connected so as to receive response parallel signals from said receiving circuit,
   wherein each of said test parallel signals includes a pulse sequence, and each of said response parallel signals includes a pulse sequence,
   wherein said test signal generating circuit comprises a first circuit for generating test parallel signals that are equivalent to said first parallel signals for a plurality of channels, and
   wherein said operation judging circuit comprises: a plurality of second circuits each capable of holding a value of one pulse in its associated one of the pulse sequences of said response parallel signals received from said receiving circuit; a plurality of third circuits for generating expected values for pulses of pulse sequences in the response parallel signals received from said receiving circuit after the pulses whose signal values have been held, based on signal values held in said second circuits; and a plurality of fourth circuits for comparing values of pulses of the pulse sequences in the response parallel signals received from said receiving circuit with the expected values generated by said third circuits.

2. A semiconductor integrated circuit according to claim 1, wherein when said test parallel signals constitute such a multi-bit signal that each pulse of a pulse sequence in each of the test parallel signals forms one bit, said first circuit comprises:
   a plurality of first flip-flop circuits for sending out said multi-bit test parallel signals;
   a plurality of second flip-flop circuits disposed in a stage preceding that of said first flip-flop circuits; and
   a plurality of exclusive OR circuits each for comparing values of two bits located at a distance of a predetermined number of bits between and included in bits of the test parallel signals supplied from said plurality of first flip-flap circuits, and supplying a result of the comparison to corresponding one of said plurality of first flip-flop circuits.

3. A semiconductor integrated circuit according to claim 2, wherein said operation judging circuit comprises an AND circuit for performing an AND-ing function on outputs of exclusive NOR circuits of said plurality of fourth circuits.

4. A semiconductor integrated circuit according to claim 2, wherein said operation judging circuit comprises:
   an AND circuit for performing an AND-ing function on outputs of exclusive NOR circuits of said plurality of fourth circuits;
   a third flip-flop circuit for taking in an output of said AND circuit in synchronism with a clock signal; and
   an SR latch circuit that is set by an output of said third flip-flop circuit.

5. A semiconductor integrated circuit according to claim 2, wherein said operation judging circuit comprises:

an AND circuit for performing an AND-ing function on outputs of exclusive NOR circuits of said plurality of fourth circuits;

a third flip-flop circuit for taking in an output of said AND circuit in synchronism with a clock signal;

an SR latch circuit that is set by an output of said third flip-flop circuit; and a reset circuit for canceling a reset state of said SR latch circuit upon elapse of a predetermined time after a circuit disposed in a stage preceding that of said SR latch circuit is reset.

6. A semiconductor integrated circuit according to claim 1, wherein said test signal generating circuit and said operation judging circuit are formed so as to operate in accordance with a clock having a frequency corresponding to a transfer rate of said first or second parallel signals.

* * * * *